(12) United States Patent
Negishi

(10) Patent No.: US 8,769,363 B2
(45) Date of Patent: Jul. 1, 2014

(54) TEST APPARATUS

(75) Inventor: Toshiyuki Negishi, Gunma (JP)

(73) Assignee: Advantest Corporation, Tokyo (JP)

( * ) Notice: Subject to any disclaimer, the term of this patent is extended or adjusted under 35 U.S.C. 154(b) by 203 days.

(21) Appl. No.: 13/403,985

(22) Filed: Feb. 24, 2012

(65) Prior Publication Data

US 2012/0226951 A1 Sep. 6, 2012

(30) Foreign Application Priority Data

Mar. 4, 2011 (JP) ................................ 2011-048196

(51) Int. Cl.
*G01R 31/28* (2006.01)
*G06F 11/00* (2006.01)

(52) U.S. Cl.
USPC ........................................ 714/744; 714/738

(58) Field of Classification Search
USPC ................................................ 714/738, 744
See application file for complete search history.

(56) References Cited

U.S. PATENT DOCUMENTS

| | | | | |
|---|---|---|---|---|
| 5,390,192 A | * | 2/1995 | Fujieda | 714/744 |
| 5,617,531 A | * | 4/1997 | Crouch et al. | 714/30 |
| 6,374,392 B1 | * | 4/2002 | Ochiai et al. | 716/113 |
| 2005/0193303 A1 | * | 9/2005 | Konuk | 714/738 |

FOREIGN PATENT DOCUMENTS

| | | |
|---|---|---|
| JP | 2000-11692 A | 1/2000 |
| KR | 2007-0051618 A | 5/2007 |
| KR | 2011-0005270 A | 1/2011 |

OTHER PUBLICATIONS

"Notice of Office Action" issued by the Korean Intellectual Property Office for application No. 10-2012-0020916.

* cited by examiner

*Primary Examiner* — Sam Rizk

(57) ABSTRACT

Provided is a test apparatus comprising a plurality of pattern output sections. In a high-speed mode, each pattern output section outputs, as pattern data corresponding to at least one of a plurality of partial periods, the pattern data corresponding to an input pattern input to the pattern output section and the pattern data corresponding to input patterns input to other pattern output sections.

9 Claims, 7 Drawing Sheets

32

| DATA BIT | 5 | 4 | 3 | 2 | 1 | 0 |
|---|---|---|---|---|---|---|
| 32-A | T5 | | T3 | | T1 | |
| 0 | | | 0 | 1 | 1 | 0 |
| I | | | 0 | 1 | 0 | 1 |
| L | 1 | 0 | 1 | 0 | | |
| H | 0 | 1 | 1 | 0 | | |
| Z | 1 | 1 | 1 | 0 | | |
| X | 0 | 0 | 1 | 0 | | |
| 32-B | T6 | | T4 | | T2 | |

LPAT { rows 0, I, L, H, Z, X }

FIG. 3

TEST APPARATUS

BACKGROUND

1. Technical Field

The present invention relates to a test apparatus.

2. Related Art

Conventionally, as a test apparatus that tests devices such as memories, an apparatus is known that tests high-speed devices such as DDR devices, as shown in Patent Document 1, for example. This test apparatus has a normal mode for generating one piece of pattern data for each prescribed test period and a high-speed mode for generating a plurality of pieces of pattern data for each test period.

Patent Document 1: Japanese Patent Application Publication No. 2000-11692

The test apparatus includes a data memory that stores a plurality of predetermined patterns and outputs a designated pattern for each test period. Each pattern in the data memory includes a number of bits corresponding to the number of pieces of pattern data, and therefore a plurality of pieces of pattern data can be generated for each test period.

For example, each pattern may include a first-half bit sequence corresponding to the first half of the test period and a second-half bit sequence corresponding to the second half of the test period. The pattern data for the first half is generated according to the first-half bit sequence, and the pattern data for the second half is generated according to the second-half bit sequence, and therefore the pattern data can be generated at much higher speed. Furthermore, the pattern data can be generated in the normal mode by selecting a pattern that causes the first-half bit sequence and the second-half bit sequence to be the same.

However, there are cases where the number of bits of a designation signal for designating a pattern of the data memory is determined according to the number of patterns to be generated in the normal mode. For example, when a data pattern PAT to be input to the device under test has a binary value of I/O and an expected value pattern EXP to be compared to the output signal from the device under test has 4 values of H/L/Z/H, 6 (2+4) patterns should be able to be generated in the normal mode. In this case, the number of bits of the designation signal is set to 3.

In response to this, in the high-speed mode, there are four types of values for the data pattern PAT in a test period, which are (first-half data, second-half data) values of (0, 0), (1, 0), (0, 1), and (1, 1). In the same manner, the expected value pattern EXP in a test period has 16 (4×4) types of values. Therefore, it is impossible to designate all of the patterns in the high-speed mode using a 3-bit designation signal.

For example, eight pattern can be designated using a 3-bit designation signal, and therefore when the data pattern PAT is allocated to the patterns of four designation signals, only four designation signal patterns can be allocated to the expected value pattern EXP. As a result, it is impossible to designate each high-speed expected value pattern EXP.

SUMMARY

Therefore, it is an object of an aspect of the innovations herein to provide a test apparatus, which is capable of overcoming the above drawbacks accompanying the related art. The above and other objects can be achieved by combinations described in the independent claims. According to a first aspect related to the innovations herein, provided is a test apparatus that tests a device under test based on pattern data, comprising a plurality of pattern output sections that each output pattern data corresponding to an input pattern input thereto, in synchronization with a predetermined test period. Each pattern output section has two operating modes that are a normal mode in which one piece of pattern data is output in each test period and a high-speed mode in which a piece of pattern data is output in each of a plurality of partial periods obtained by dividing the test period, and in the high-speed mode, each pattern output section outputs, as the pattern data corresponding to at least one of the partial periods, the pattern data corresponding to the input pattern input to the pattern output section and the pattern data corresponding to the input patterns input to other pattern output sections.

The summary clause does not necessarily describe all necessary features of the embodiments of the present invention. The present invention may also be a sub-combination of the features described above.

BRIEF DESCRIPTION OF THE DRAWINGS

FIG. 3 shows an exemplary table stored by a data memory 32.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
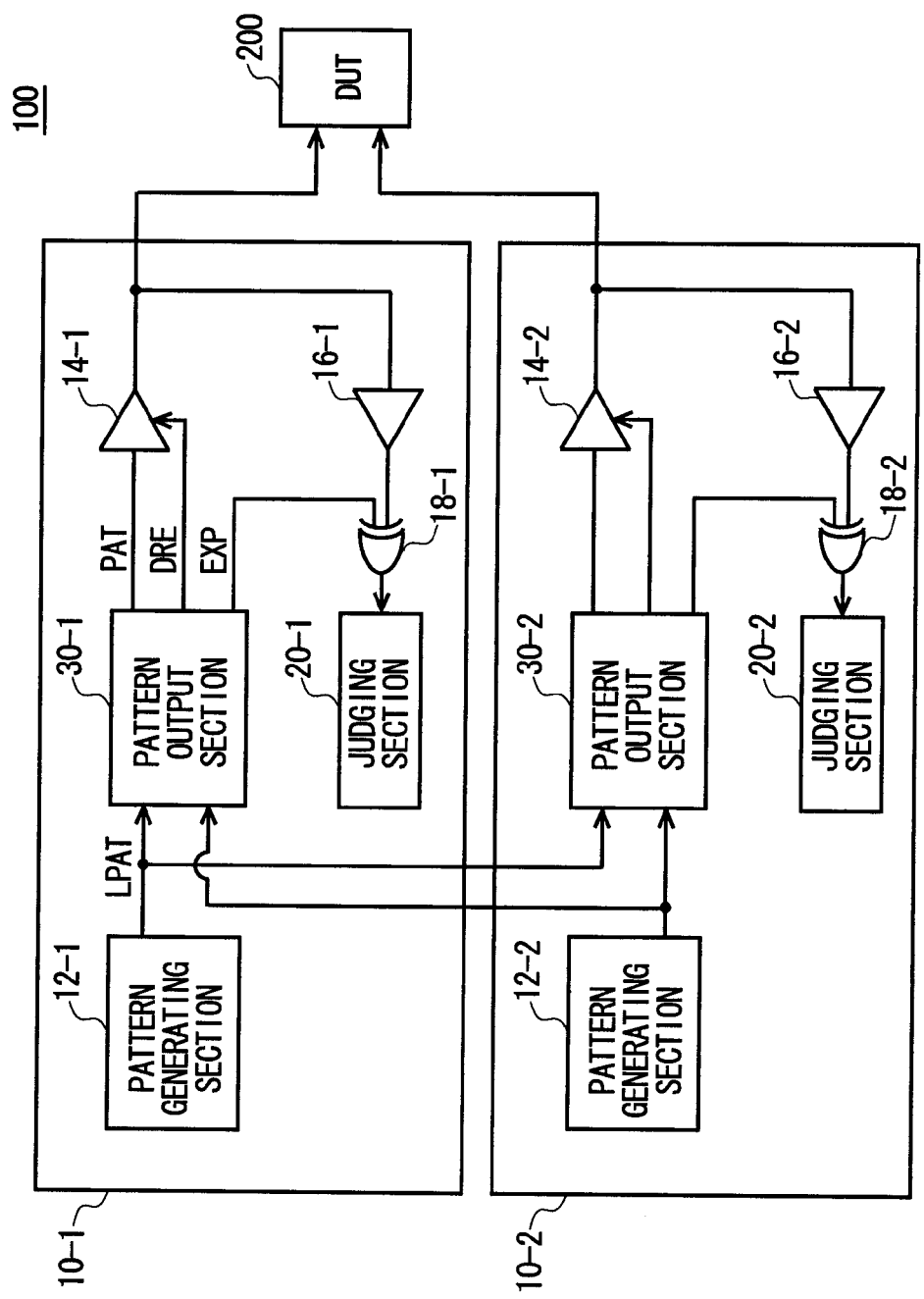
FIG. 1 shows an exemplary configuration of a test apparatus 100 that tests a device under test 200 based on pattern data.

FIG. 1 shows an exemplary configuration of a test apparatus 100 that tests a device under test 200 based on pattern data. The device under test 200 includes at least one of a memory, a logic circuit, and an analog circuit, for example. The device under test 200 may be a semiconductor device, for example.

The test apparatus 100 inputs to the device under test 200 a test signal corresponding to pattern data. The test apparatus 100 judges pass/fail of the device under test 200 by comparing the value of the output signal output by the device under test 200 in response to the test signal to an expected value corresponding to the pattern data. The test apparatus 100 includes a plurality of input/output sections 10 (input/output sections 10-1 and 10-2 in the present embodiment).

Each input/output section 10 is connected to a different pin of the device under test 200 or to a different device under test 200. Each input/output section 10 inputs a test signal into the device under test 200 and receives an output signal from the device under test 200.

Each input/output section 10 includes a pattern generating section 12, a pattern output section 30, a driver 14, a comparator 16, a comparing section 18, and a judging section 20. The pattern generating section 12 outputs an input pattern LPAT in synchronization with a predetermined test period. The test period is a predetermined period.

The input pattern LPAT defines at least one of an expected value of the output signal and a logic value of the test signal in a cycle corresponding to the test period. Each input/output section 10 includes two modes, which are a normal mode in which the logic value of the test signal can transition one time within a test period and a high-speed mode in which the logic value of the test signal can transition within each of a plurality of partial periods obtained by dividing the test period.

The pattern generating section 12 may include an algorithmic pattern generating circuit that generates the input pattern LPAT according to a predetermined algorithm. The pattern generating section 12 may include a sequential pattern generating circuit that generates the input pattern LPAT according to a predetermined sequence. The algorithm and sequence can be set by a user of the test apparatus 100.

The pattern output section 30 receives the input pattern LPAT from the pattern generating section 12 in synchronization with the test period. The pattern output section 30 in each input/output section 10 receives an input pattern LPAT from the pattern generating section 12 within its own input/output section 10 and also from the pattern generating section 12 in at least one other input/output section 10.

The pattern output section 30 outputs pattern data corresponding to the received input pattern LPAT. The pattern data includes bits indicating the data pattern PAT to be input to the driver 14, bits indicating an enable pattern DRE for controlling whether the driver 14 operates, and bits indicating the expected value pattern EXP to be input to the comparing section 18. For example, the pattern data may include two bits for the data pattern PAT, two bits for the enable pattern DRE, and two bits for the expected value pattern EXP.

In the normal mode, the pattern output section 30 outputs one piece of pattern data in each test period. At this time, the pattern output section 30 outputs the pattern data corresponding to the input pattern LPAT input from the corresponding pattern generating section 12.

In the high-speed mode, the pattern output section 30 outputs a piece of pattern data in each partial period obtained by dividing the test period. At this time, the pattern output section 30 generates pattern data corresponding to the input pattern LPAT input from the corresponding pattern generating section 12, e.g. the pattern generating section 12-1. Furthermore, the pattern output section 30 receives an input pattern LPAT from another pattern generating section 12 in another input/output section 10, e.g. the pattern generating section 12-2, that is branched to this pattern output section 30 in addition to the other pattern output section 30, e.g. the pattern output section 30-2, and generates pattern data corresponding to this input pattern LPAT. The pattern output section 30 outputs each of these pieces of pattern data as at least one of the pieces of pattern data corresponding to the partial periods.

The driver 14 is provided to correspond to the pattern output section 30. The driver 14 outputs a test signal corresponding to the data pattern PAT output by the corresponding pattern output section 30. The driver 14 may output the test signal with a logic value corresponding to the data pattern PAT in each cycle of the test period. Furthermore, the driver 14 may switch whether the test signal is output, according to the enable pattern DRE output by the corresponding pattern output section 30.

The comparator 16 receives the output signal of the device under test 200 and detects the logic value of the output signal. The comparator 16 may sample the logic value of the output signal, with a period corresponding to the operating mode and the test period. When in the normal mode, for example, the comparator 16 samples the logic value of the output signal once in each cycle of the test period. When in a high-speed mode in which the test period is divided in two, the comparator 16 samples the logic value of the output signal once in each of these partial periods.

The comparing section 18 is provided to correspond to the pattern output section 30. The comparing section 18 compares the expected value corresponding to the expected value pattern EXP output by the corresponding pattern output section 30 to the value of the output signal of the device under test 200. The comparing section 18 of the present embodiment compares the logic value output by the comparator 16 to the expected value.

The judging section 20 judges pass/fail of the device under test 200 based on the comparison results from the comparing section 18. When the comparing section 18 detects a mismatch between the output signal value and the expected value, the judging section 20 may judge the device under test 200 to be a fail. When the comparing section 18 detects a match between the output signal value and the expected value, the judging section 20 may judge the device under test 200 to be a pass.

Figure 2:
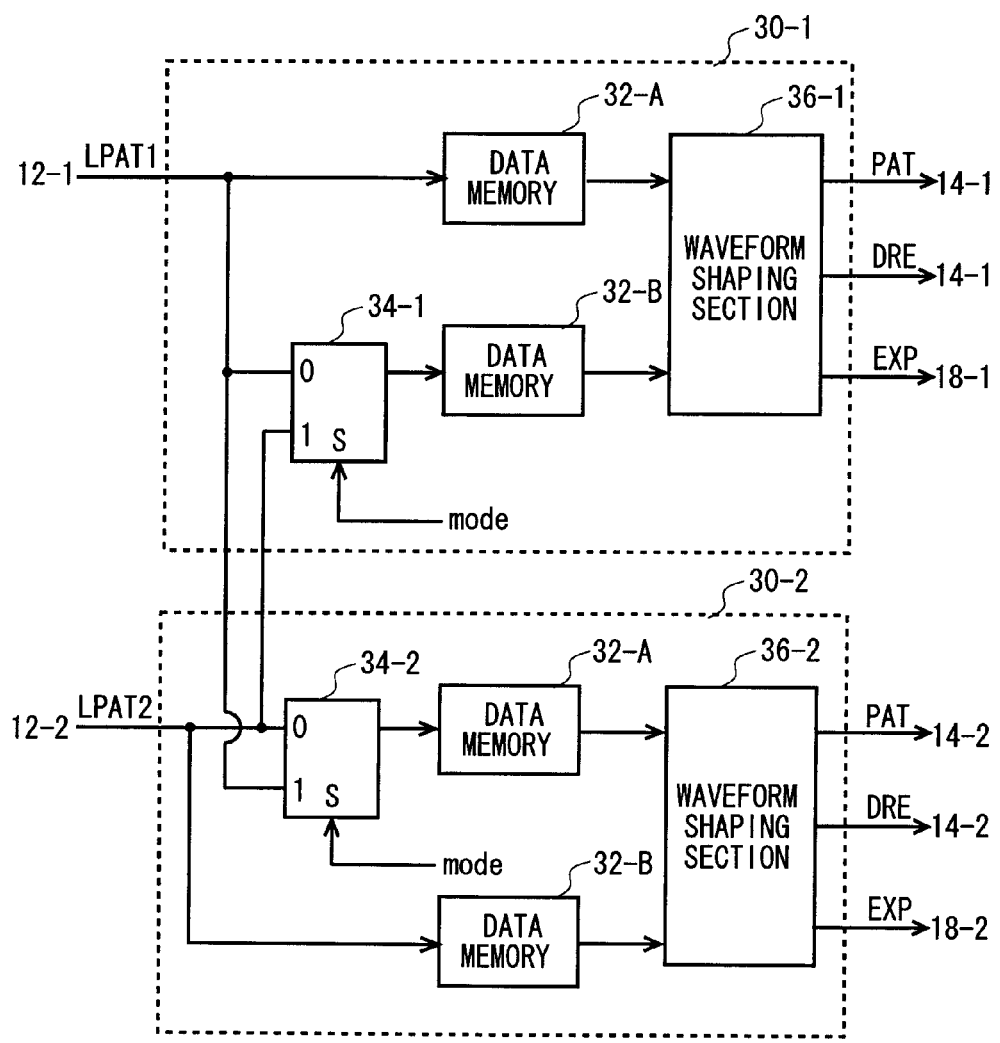
FIG. 2 shows an exemplary configuration of pattern output sections 30.

FIG. 2 shows an exemplary configuration of pattern output sections 30. Each pattern output section 30 includes a plurality of data memories 32 (data memory 32-A and data memory 32-B in the present embodiment), an input switching section 34, and a waveform shaping section 36. The data memories 32 are provided to correspond to the plurality of partial periods in the high-speed mode. For example, when the test period is divided into a maximum of N partial periods in the high-speed mode, each pattern output section 30 may include N data memories 32.

Each data memory 32 stores a table indicating the relationship between the pattern data and the input pattern data LPAT. Each data memory 32 outputs the pattern data corresponding to the received input pattern LPAT. Each data memory 32 outputs the pattern data in a partial period.

Each data memory 32 stores pattern data enabling generation of all patterns of logic values for the expected value and logic values for the test signal. In each data memory 32, the number of bits k of the designation signal, e.g. an address signal, designating the pattern data may be the minimum number needed to designate all patterns of logic values for the expected value and logic values for the test signal. For example, when there are a total of m types of patterns of logic values for the expected value and logic values for the test signal, the number of bits k may be the minimum integer that satisfies the expression $m \leq 2^k$.

In the normal mode, the input switching section 34 inputs to each data memory 32 the input pattern LPAT input to the pattern output section 30 including this input switching section 34 from the corresponding pattern generating section 12. In the high-speed mode, the input switching section 34 inputs to at least one data memory 32 an input pattern LPAT input to another pattern output section 30 from another pattern generating section 12.

The present embodiment describes an example in which the test period is divided in two in the high-speed mode. In this case, each pattern output section 30-1 includes a first data memory 32-A and a second data memory 32-B. The first data memory 32-A in the first pattern output section 30-1 receives a first input pattern LPAT1 corresponding to the first pattern output section 30-1. The second data memory 32-B of the second pattern output section 30-2 receives a second input pattern LPAT2 corresponding to the second pattern output section 30-2.

In the high-speed mode, the input switching section 34-1 of the first pattern output section 30-1 inputs, to one of the data memories 32 in the first pattern output section 30-1, the input pattern LPAT2 of the second pattern output section 30-2. Furthermore, the input switching section 34-2 of the second pattern output section 30-2 inputs, to one of the data memories 32 in the second pattern output section 30-2, the input pattern LPAT1 of the first pattern output section 30-1.

More specifically, the first input switching section 34-1 of the first pattern output section 30-1 switches the input pattern LPAT input to the second data memory 32-B of the first pattern output section 30-1 according to the operating mode (mode signal). The first input switching section 34-1 inputs the first input pattern LPAT1 to the second data memory 32-B when in the normal mode, and inputs the second input pattern LPAT2 to the second data memory 32-B when in the high-speed mode.

The second input switching section 34-2 of the second pattern output section 30-2 switches the input pattern LPAT input to the first data memory 32-A of the second pattern output section 30-2 according to the operating mode (mode signal). The second input switching section 34-2 inputs the second input pattern LPAT2 to the first data memory 32-A when in the normal mode, and inputs the first input pattern LPAT1 to the first data memory 32-A when in the high-speed mode.

The waveform shaping section 36 outputs a signal corresponding to the pattern data output by the data memories 32. The waveform shaping section 36 outputs the pattern data output by each data memory 32 in the corresponding partial period. The waveform shaping section 36 of the present embodiment outputs the pattern data from the first data memory 32-A in the first-half partial period, and outputs the pattern data from the second data memory 32-B in the second-half partial period.

The data memories 32 within the same pattern output section 30 store the same table. With this configuration, the pattern data output in each partial period can be selected from among all of the pattern data. Therefore, even in the high-speed mode, the pattern data can be selected with a high degree of freedom. Furthermore, in the normal mode, the same input pattern LPAT is input to the data memories 32 in the same pattern output section 30, and therefore the pattern data is the same in each partial period and pattern data synchronized with the test period can be output.

Furthermore, data memories 32 in different pattern output sections 30 may store the same table. In this case, in the high-speed mode, the pattern data output by the first pattern output section 30-1 is the same as the pattern data output by the second pattern output section 30-2.

The data memories 32 of the second pattern output section 30-2 may store a table in which the logic values of the bits corresponding to the data pattern PAT and the expected value pattern EXP are inverted with respect to the logic values in the data memories 32 of the first pattern output section 30-1. In this case, in the high-speed mode, the pattern data output by the first pattern output section 30-1 and the second pattern output section 30-2 is inverted. Therefore, this configuration can also be used when testing a differential device.

FIG. 3 shows an exemplary table stored by a data memory 32. The following example uses a data memory 32 in the first pattern output section 30-1. As described above, the first data memory 32-A and the second data memory 32-B store the same table.

In the present example, each word in the table includes 6 bits, which are a 0-th bit to a fifth bit. The 0-th and first bits define the data pattern PAT. The second and third bits define the enable pattern DRE. The fourth and fifth bits define the expected value pattern EXP.

In this example, the table includes pattern data 0 and 1 corresponding to two types of data patterns PAT and pattern data L, H, Z, and X corresponding to four types of expected value patterns EXP. The expected value L indicates that the signal level of the output signal is less than a prescribed threshold value VOL, and the expected value H indicates that the signal level of the output signal is greater than a prescribed threshold value VOH. The threshold value VOH is higher than the threshold value VOL. The expected value Z indicates that the signal level of the output signal is between the threshold value VOL and the threshold value VOH, and the expected value X indicates that the signal level of the output signal is an arbitrary level.

In the pattern data 0 and 1, the enable pattern DRE (second and third bits) indicates an enable pattern ((third bit, second bit)=(0, 1)) causing the driver 14 to operate. In the pattern data L, H, Z, and X, the enable pattern DRE indicates a disable pattern ((third bit, second bit)=(1, 0)) that disables the driver 14.

The pattern of the 0-th and first bits in the first data memory 32-A is allocated to a time slot T1 that is described further below, the pattern of the second and third bits is allocated to a time slot T3, and the pattern of the fourth and fifth bits is allocated to a time slot T5. In the same manner, the pattern of the 0-th and first bits in the second data memory 32-B is allocated to a time slot T2, the pattern of the second and third bits is allocated to a time slot T4, and the pattern of the fourth and fifth bits is allocated to a time slot T6.

Figure 4:
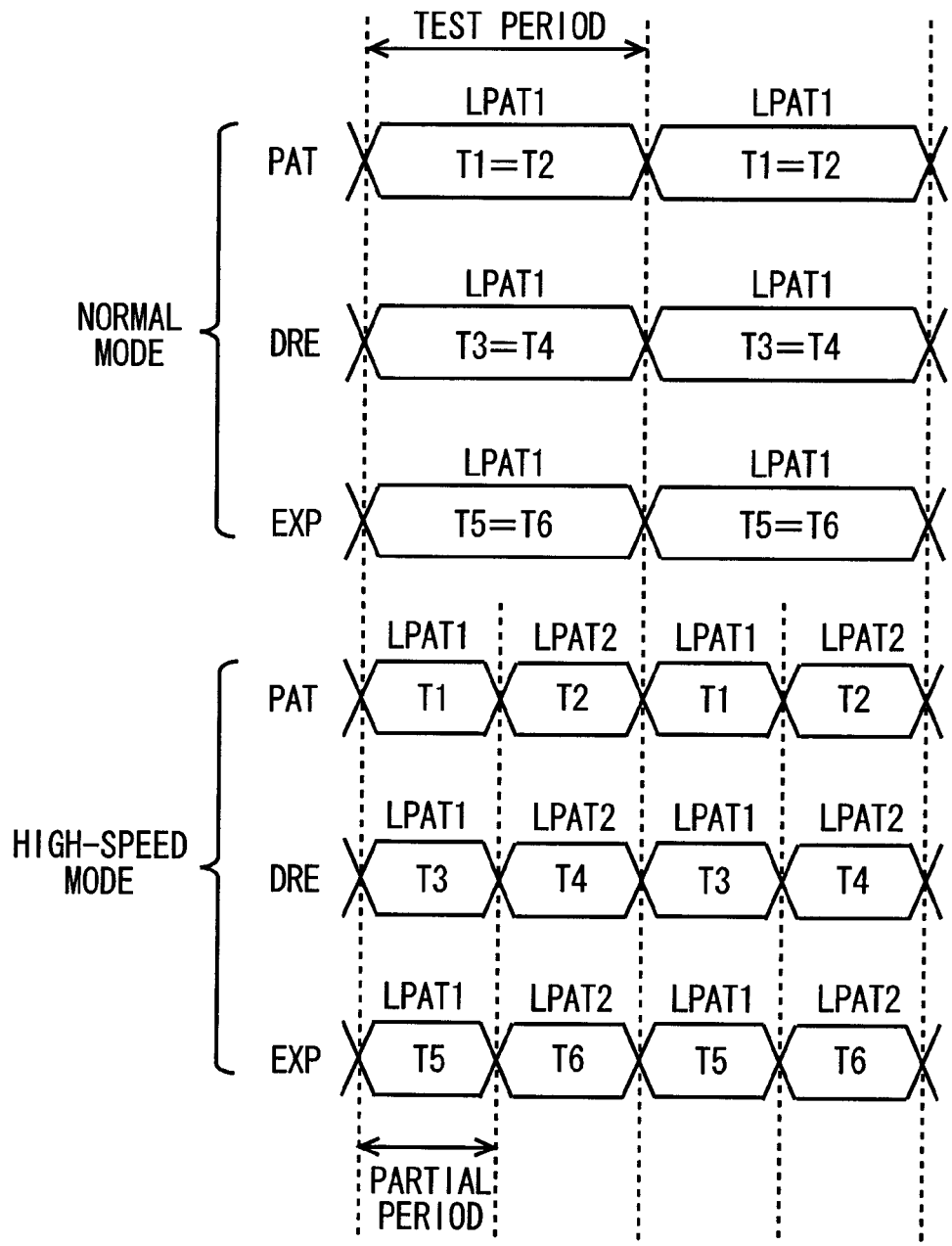
FIG. 4 shows exemplary pattern data output by a waveform shaping section 36.

FIG. 4 shows exemplary pattern data output by a waveform shaping section 36. This embodiment uses the waveform shaping section 36-1 of the first pattern output section 30-1 as an example. The waveform shaping section 36-1 outputs the patterns corresponding to the time slots T1, T3, and T5 respectively as the pattern data PAT, the enable pattern DRE, and the expected value pattern EXP in the first-half partial period. The waveform shaping section 36-2 outputs the patterns corresponding to the time slots T2, T4, and T6 respectively as the pattern data PAT, the enable pattern DRE, and the expected value pattern EXP in the second-half partial period.

In the normal mode, the waveform shaping section 36-1 receives the pattern data corresponding to the first input pattern LPAT1 from both the data memory 32-A and the data memory 32-B. In other words, the waveform shaping section 36-1 outputs the same pattern data in the first-half partial period and the second-half partial period, and therefore outputs pattern data in synchronization with the test period.

In the high-speed mode, the waveform shaping section 36-1 receives pattern data corresponding to the first input pattern LPAT1 from the data memory 32-A, and receives pattern data corresponding to the second input pattern LPAT2 from the data memory 32-B. Therefore, the waveform shaping section 36-2 outputs pattern data corresponding to the first input pattern LPAT1 in the first-half partial period obtained by dividing the test period, and outputs pattern data corresponding to the second input pattern LPAT2 in the second-half partial period. In other words, the waveform shaping section 36-1 outputs the pattern data in synchronization with partial periods.

In this way, the pattern output section 30 can output pattern data corresponding to different input patterns LPAT in each partial period when in the high-speed mode. Therefore, high-speed data with a high degree of freedom can be output without increasing the number of bits of the input pattern. In other words, high-speed data with a high degree of freedom can be output without increasing the circuit size of the pattern generating section 12.

Figure 5:
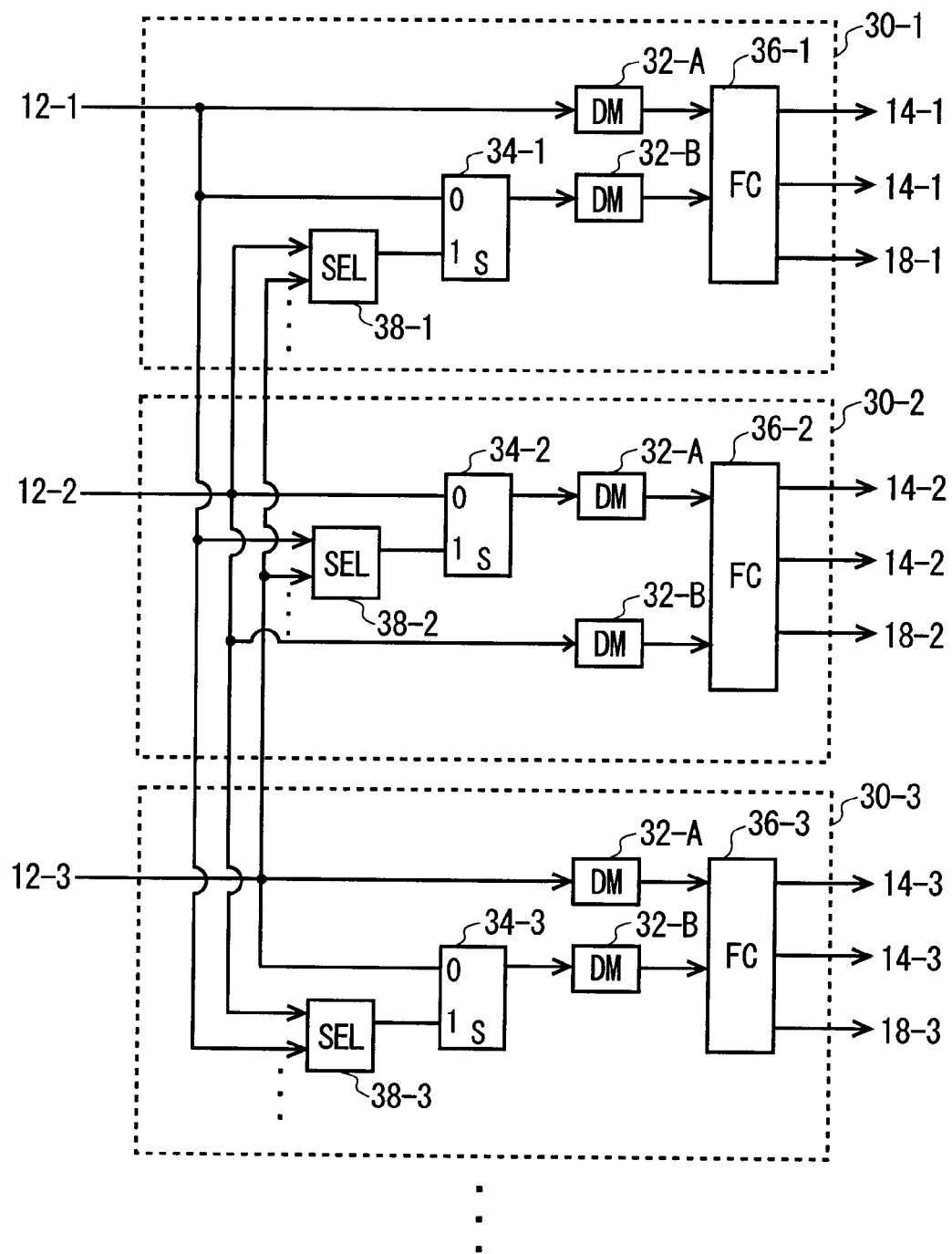
FIG. 5 shows another exemplary configuration of pattern output sections 30.

FIG. 5 shows another exemplary configuration of pattern output sections 30. Each pattern output section 30 of the present embodiment further includes a pin selecting section 38 in addition to the configuration of the pattern output section 30 described in relation to FIG. 2. The remaining configuration may be the same as that of the pattern output section 30 described in relation to FIG. 2.

Each pin selecting section 38 receives the input patterns LPAT input to the pattern output sections 30 other than the pattern output section 30 containing the pin selecting section 38. Here, the input patterns LPAT input to the other pattern output section 30 refers to the input patterns input from the pattern generating sections 12-k corresponding to the pattern output sections 30-k.

Each pin selecting section 38 selects one of the input patterns LPAT and inputs the selected input pattern LPAT into the corresponding input switching section 34. In the high-speed mode, the input switching section 34 inputs the input pattern LPAT received from the pin selecting section 38 into the corresponding data memory 32. In this way, when in the high-speed mode, the pin selecting section 38 selects an input pattern LPAT input to another pattern output section 30 and inputs the selected input pattern LPAT into at least one data memory 32.

With this configuration, a variety of pattern output sections 30 can be combined to operate in the high-speed mode. Therefore, pattern data with a higher degree of freedom can be generated.

The number of pattern output sections 30 provided may be such that the number of pattern output sections 30 including pin selecting sections 38 and input switching sections 34 for the first data memory 32-A is the same as the number of pattern output sections 30 including pin selecting sections 38 and input switching sections 34 for the second data memory 32-B. Furthermore, among each pair of pattern output sections 30 disposed adjacently on the circuit substrate, one may be a pattern output section 30 including a pin selecting section 38 and an input switching section 34 for the first data memory 32-A and the other may be a pattern output section 30 including a pin selecting section 38 and an input switching section 34 for the second data memory 32-B.

When the pin selecting section 38 of the pattern output section 30-a selects the input pattern LPATb corresponding to the pattern output section 30-b, the pin selecting section 38 of the pattern output section 30-b may select the input pattern LPATa corresponding to the pattern output section 30a. Here, a and b are each integers that designate one of the plurality of pattern output sections 30.

Figure 6:
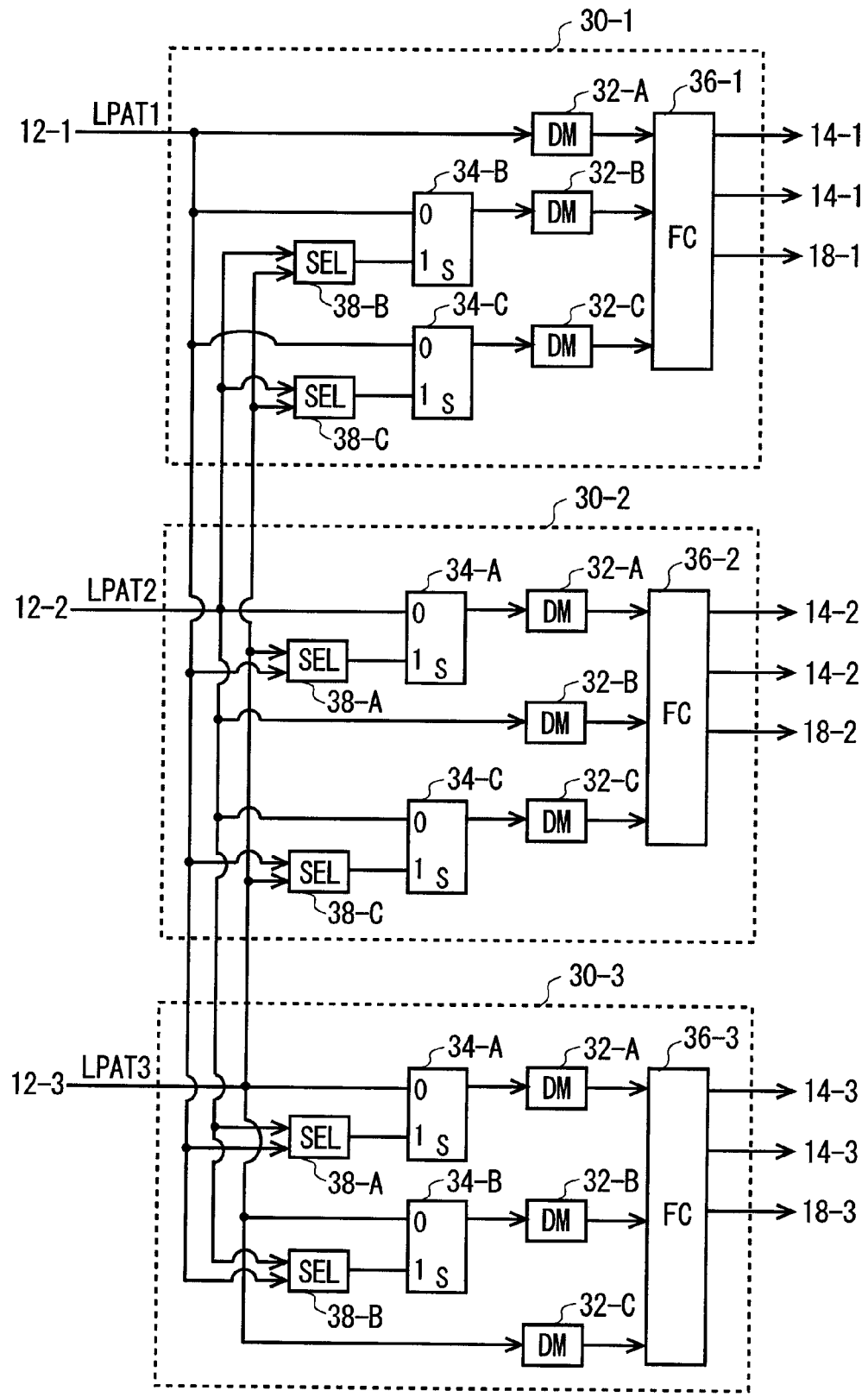
FIG. 6 shows another exemplary configuration of pattern output sections 30.

FIG. 6 shows another exemplary configuration of pattern output sections 30. Each pattern output section 30 in the present embodiment operates according to a partial period obtained by dividing the test period by N in the high-speed mode. Here, N is an integer greater than or equal to 3. In FIG. 6, N is equal to 3.

Each pattern output section 30 receives branched input patterns LPAT corresponding to the other N−1 pattern output sections 30. Each pattern output section 30 includes N data memories 32, N−1 input switching sections 34, N−1 pin selecting sections 38, and a waveform shaping section 36.

In the pattern output section 30-k, where k is an integer from 1 to N, the N−1 input switching sections 34 may be provided to correspond to the data memories 32 other than the k-th data memory 32. The waveform shaping section 36 outputs pattern data corresponding to the pattern data sequence including each piece of pattern data from the pattern data output by the first data memory 32 to the pattern data output by the N-th data memory 32, in this order.

The p-th input switching section 34 in the pattern output section 30 may receive the input pattern LPAT corresponding to this pattern output section 30 and the input pattern corresponding to the p-th pattern output section 30. As shown in FIG. 6, each input switching section 34 may receive the input pattern selected by the corresponding pin selecting section 38 and the input pattern LPAT corresponding to the pattern output section 30 containing the input switching section 34.

Each pin selecting section 38 may receive input patterns LPAT corresponding to all of the pattern output sections 30 except the pattern output section 30 containing the pin selecting section 38. Each pin selecting section 38 may select one of these input patterns and input the selected input pattern into the corresponding input switching section 34. With this configuration, a variety of types of pattern data can be generated.

Figure 7:
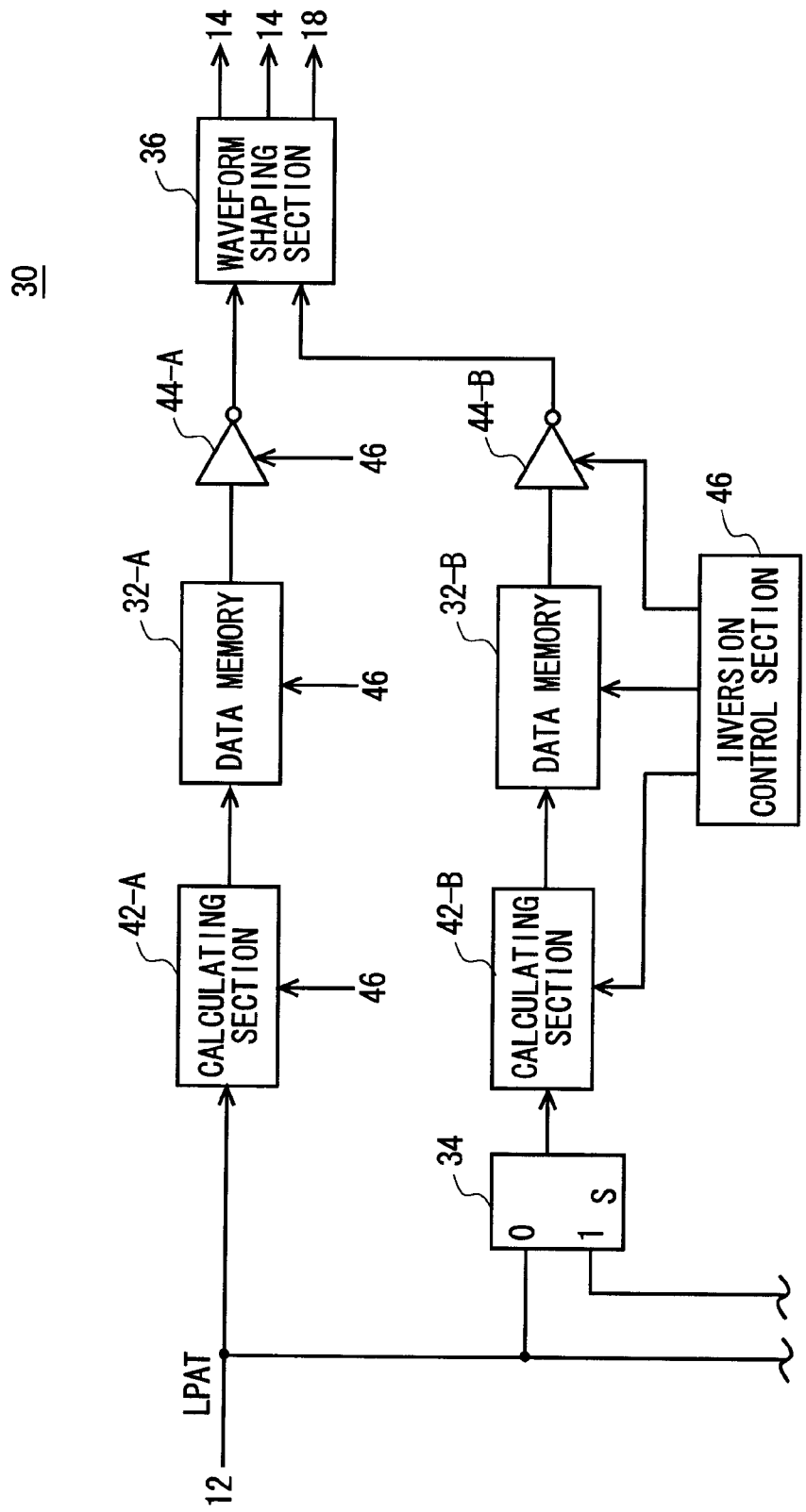
FIG. 7 shows another exemplary configuration of a second pattern output section 30.

FIG. 7 shows another exemplary configuration of a second pattern output section 30. The second pattern output section 30 of the present embodiment further includes an inversion control section 46 in addition to the configuration of each pattern output section 30 described in relation to FIGS. 2 to 5. Furthermore, the second pattern output section 30 may further include one of a calculating section 42 and a signal inverting section 44.

The inversion control section 46 controls whether the second pattern output section 30-2 outputs a signal that is inverted with respect to the signal from the first pattern output section 30-1. For example, the inversion control section 46 may cause a table identical to the table of the data memory 32 of the second pattern output section 30-2 to be stored in each data memory 32 of the second pattern output section 30-2, or cause a table including inversions of the logic values of the bits corresponding to the data pattern PAT and the expected value pattern EXP in the pattern data to be stored in each data memory 32 of the second pattern output section 30-2. Therefore, the signals output by the first pattern output section 30-1 and the second pattern output section 30-2 can form a differential signal.

If the second pattern output section 30-2 includes the signal inverting section 44, the inversion control section 46 may control whether the signal of the second pattern output section 30 is inverted by controlling the signal inverting section 44. The signal inverting section 44 switches whether the output logic values of the bits corresponding to the data pattern PAT and the expected value pattern EXP in the pattern data output by each data memory 32 are inverted.

If the second pattern output section 30-2 includes the calculating section 42, the inversion control section 46 may control whether the signal of the second pattern output section 30 is inverted by controlling the calculating section 42. The calculating section 42 switches whether the input pattern LPAT input to each data memory 32 is transmitted as-is or is converted into a different converted pattern.

The converted pattern is a pattern that designates pattern data in which the logic values of the bits corresponding to the data pattern PAT and the expected value pattern EXP are inverted with respect to the pattern data of the originally selected input pattern. In FIG. 3, for example, when the input pattern LPAT designates pattern data 0, the converted pattern designates pattern data 1. Furthermore, when the input pattern LPAT designates pattern data H, the converted pattern designates pattern data L. The calculating section 42 may generate the converted pattern using a predetermined table or algorithm, for example. With this configuration as well, the signals output by the first pattern output section 30-1 and the second pattern output section 30-2 can form a differential signal.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test based on pattern data, comprising:
    a plurality of pattern output sections that each output pattern data corresponding to an input pattern input thereto, in synchronization with a predetermined test period, wherein
    each pattern output section has two operating modes that are a normal mode in which one piece of pattern data is output in each test period and a high-speed mode in which a piece of pattern data is output in each of a plurality of partial periods obtained by dividing the test period,
    each pattern output section has an input switching section that, in the normal mode, outputs the input pattern input to the pattern output section including the input switching section and, in the high-speed mode, outputs the input pattern input to another pattern output section, and
    in the high-speed mode, each pattern output section outputs, as the pattern data corresponding to at least one of the partial periods, the pattern data corresponding to the input pattern input to the pattern output section and the pattern data corresponding to the input patterns input to other pattern output sections.

2. The test apparatus according to claim 1, wherein
    each pattern output section includes a plurality of data memories corresponding to the plurality of partial periods, and
    each data memory stores a table indicating a relationship between the input pattern and the pattern data, and outputs the pattern data corresponding to the input pattern input thereto.

3. The test apparatus according to claim 2, wherein
    the input switching section of each pattern output section, in the normal mode, inputs to each data memory the input pattern input to the pattern output section including the input switching section and, in the high-speed mode, inputs to at least one data memory the input pattern input to another pattern output section, and
    each pattern output section further includes a waveform shaping section that outputs a signal corresponding to the pattern data output by the plurality of data memories.

4. The test apparatus according to claim 3, wherein
    each pattern output section further includes a pin selecting section that, in the high-speed mode, selects the input pattern input to one of the other pattern output sections and inputs the selected input pattern to the input switching section.

5. The test apparatus according to claim 3, wherein,
    in the high-speed mode, the input switching section of a first pattern output section inputs the input pattern of a second pattern output section to one of the data memories of the first pattern output section, and
    in the high-speed mode, the input switching section of the second pattern output section inputs the input pattern of the first pattern output section to one of the data memories of the second pattern output section.

6. The test apparatus according to claim 5, further comprising an inversion control section that controls whether the second pattern output section outputs a signal that is inverted with respect to the signal from the first pattern output section.

7. The test apparatus according to claim 6, wherein
    data memories included in the same pattern output section each store the same table, and
    the inversion control section controls whether a table that is the same as the table stored in the data memories of the first pattern output section or a table in which the pattern data is inverted is stored in the data memories of the second pattern output section.

8. The test apparatus according to claim 2, wherein
    data memories included in the same pattern output section each store the same table.

9. The test apparatus according to claim 2, further comprising:
    a plurality of drivers that correspond to the plurality of pattern output sections and that each output a test signal corresponding to the pattern data output by the corresponding pattern output section; and
    a plurality of comparing sections that correspond to the plurality of pattern output sections and that each compare an expected value corresponding to the pattern data output by the corresponding pattern output section to a value of an output signal of the device under test, wherein
    each data memory stores a table in which pattern data including a bit indicating a logic value of the test signal, a bit controlling whether the corresponding driver operates, and a bit indicating the expected value is associated with each input pattern.

* * * * *